United States Patent [19]

Scalart et al.

[11] Patent Number: 5,734,715
[45] Date of Patent: Mar. 31, 1998

[54] PROCESS AND DEVICE FOR ADAPTIVE IDENTIFICATION AND ADAPTIVE ECHO CANCELLER RELATING THERETO

[75] Inventors: Pascal Scalart, Ploubezre; Pierre Duhamel, Issy Les Moulineaux; Abdelkrim Benamar, Chelles, all of France

[73] Assignee: France Telecom, Paris, France

[21] Appl. No.: 705,529

[22] Filed: Aug. 29, 1996

[30] Foreign Application Priority Data

Sep. 13, 1995 [FR] France ................... 95 10714
Apr. 26, 1996 [FR] France ................... 96 05312

[51] Int. Cl.$^6$ ........................... H04M 9/00
[52] U.S. Cl. .................... 379/410; 379/406; 379/411
[58] Field of Search ............... 379/410, 406, 379/411, 407, 408, 409, 402, 389, 388, 390, 420

[56] References Cited

U.S. PATENT DOCUMENTS

| | | | |
|---|---|---|---|
| 4,513,177 | 4/1985 | Nishino et al. | 379/389 |
| 4,901,346 | 2/1990 | Erving | 379/389 |
| 5,559,881 | 9/1996 | Sih | 379/410 |
| 5,570,395 | 10/1996 | Myers | 375/346 |
| 5,570,423 | 10/1996 | Walker et al. | 379/411 |
| 5,577,116 | 11/1996 | Townsend et al. | 364/410 |

FOREIGN PATENT DOCUMENTS

| | | |
|---|---|---|
| 0 176 312 | 4/1986 | European Pat. Off. . |
| 0 661 832 | 7/1995 | European Pat. Off. . |
| 2208983 | 4/1989 | United Kingdom . |

OTHER PUBLICATIONS

Patent Abstracts of Japan, vol. 95, No. 005 & JP-A-07 131389 (Fujitsu Ltd), May 19, 1995.
Patent Abstracts of Japan, vol. 17, No. 69 & JP-A-04 271622 (NEC Corp), Sep. 28, 1992.

H. Perez Meana et al., "A Time Varying Step Size Normalized LMS Echo Canceller Algorithm", Proc. of Eusipco-94, pp. II-249-II-252, Edimburg, Scotland, Sep. 1994.

Dirk T.M. Slock, "On the Convergence Behavior of the LMS and the Normalized LMS Algorithms", IEEE Trans. on Signal Processing, vol. 41, No. 9, pp. 2811-2825, Sep. 1993.

K. Ozeki et al., "An Adaptive Algorithm Using an Orthogonal Projection to an Affine Subspace and Its Properties", Electronics and Communications in Japan, vol. 67-A, No. 5, pp. 19-27, 1984.

Primary Examiner—Krista Zele
Assistant Examiner—Jacques M. Saint-Surin
Attorney, Agent, or Firm—Oliff & Berridge, PLC

[57] ABSTRACT

To estimate the response of a system to an input signal, on the one hand the input signal and on the other hand an observation signal, a component of which is said response to the input signal, are received, an error signal is determined by subtracting from the observation signal the input signal filtered by an identification filter representative of the response of said system, and the coefficients of the identification filter are adapted by taking into account the input signal and the error signal. If the adaptation takes into account an adaption stepsize $\mu_t$, the latter is varied according to: $\mu_t = a/(c+d \cdot P2_t/P1_t)$, where a, c and d denote positive constants, $P1_t$ denotes an estimate of the power of the input signal and $P2_t$ denotes an estimate of the power of the observation signal or of a disturbance component of said observation signal. The variable $\mu_t$ can also be employed to adapt the gains of an echo canceller with adaptive gains.

15 Claims, 4 Drawing Sheets

PROCESS AND DEVICE FOR ADAPTIVE IDENTIFICATION AND ADAPTIVE ECHO CANCELLER RELATING THERETO

BACKGROUND OF THE INVENTION

The present invention relates to a process and a device for adaptive system identification and an adaptive echo canceller relating thereto.

The current upsurge in telecommunications within the mass consumer sector, and more particularly in radio communications with mobiles, is prompting the designers of these systems to implement optimal technical solutions in terms of comfort of use.

In this regard, industrial Research and Development teams are frequently confronted with problems of adaptive system identification. Among these problems may be mentioned, within the framework of radiocommunications with mobiles, the problematic matter of the equalization of propagation channels and acoustic echo cancellation for hands-free radiotelephony.

These problems of system identification are often solved by the use of signal processing techniques incorporating adaptive identification processes. However, up till now none of these devices has made it possible automatically to adjust to the surrounding noise conditions.

The use of such adaptive techniques of system identification has a major drawback which lies in the strong correlation between the performance achieved and the choice of control parameters associated therewith. This choice is all the more critical when the environment in which these devices are used alters over time, as may be the case, for example, in respect of acoustic echo cancellation in the context of radiocommunications with mobiles.

These devices implement identification algorithms which are characterized in their temporal form by the following general equations (see S. Haykin, "Adaptive Filter Theory", Englewood Cliffs, N.J. Prentice-Hall, 1991):

$$e_t = y_t - \langle H_{L,t-1}, X_{L,t} \rangle \tag{1}$$

$$H_{L,t} = H_{L,t-1} + \mu_t \cdot f(X_{L,t}; e_t; \lambda_t) \tag{2}$$

where $\langle .,. \rangle$ represents the scalar product of two vectors, $H_{L,t}$ is a vector representing the impulse response of the identification filter of size L at the instant t, $\mu t$ is a normalized adaptation stepsize, $X_{L,t} = (x_t, x_{t-1}, \ldots, x_{t-L+1})$ is the vector consisting of the last L samples of the input signal $x_t$, $y_t$ is the current sample of the observation signal, $e_t$ is the a priori filtering error, $\lambda_t$ is a forgetting factor, and f(.) is the function making it possible to distinguish between these various algorithms. Note that the forgetting factor makes it possible to estimate correlation coefficients which are smoothed over time, these coefficients being inherent in identification algorithms. The NLMS (Normalized Least Mean Squares, see the above-mentioned work by S. Haykin) algorithm, for example, is characterized by the following equations:

$$e_t = y_t - \langle H_{L,t-1}, H_{L,t} \rangle \tag{1}$$

$$H_{L,t} = H_{L,t-1} + \mu_t \cdot \frac{e_t \cdot X_{L,t}}{|X_{L,t}|^2} \tag{2bis}$$

where $\|.\|^2$ represents the square of the norm of a vector.

This formulation ((1) and (2)) makes reference to a temporal algorithm, but it may be noted that the method presented here is equally valid for frequency-based algorithms.

Furthermore, certain algorithms use an adaptation stepsize and/or a forgetting factor. Thus, the Fast Recursive Least Squares (FRLS) algorithms (see the above-mentioned work by S. Haykin) use only a forgetting factor, whereas the algorithms of gradient type (see the above-mentioned work by S. Haykin) and projection type (see the article by K. Ozeki and T. Umeda, "An Adaptive Algorithm Using an Orthogonal Projection to an Affine Subspace and Its Properties", Electronics and Communications in Japan, vol. 67-A, no. 5, pp. 19–27, 1984) use an adaptation stepsize and sometimes a forgetting factor.

As stated earlier, the performance of these algorithms (speed of convergence, capacity to track non-stationarities, misfit after convergence) are intimately related to the choice of the magnitudes $\lambda_t$ and $\mu_t$. These are adjusted, in general, depending on the nature of the signals processed and on the level of the observation noise characteristic of the desired application. Thus, in the case of highly noise-affected signals, the advice is to take an adaptation stepsize very close to 0 and a forgetting factor very close to 1 in order to enhance the robustness of these algorithms to noise. On the other hand, in the case of weakly noise-affected signals, an adaptation stepsize close to 1 makes it possible to obtain a faster rate of convergence of the identification algorithm to the optimal solution.

More generally, in applications in which the noise level varies over time (a specific case commonly encountered in practice), setting of these parameters becomes tricky and it is often carried out by considering the most adverse conditions. Thus, within the framework of acoustic echo cancellation for hands-free radiotelephones, these magnitudes are adjusted so as to obtain satisfactory behaviour under difficult conditions (high speed, open windows, etc). It is, however, important to note that these settings limit the performance of the algorithms in question under less adverse conditions (vehicle at rest for example in respect of acoustic echo cancellation).

These difficulties in setting the control parameters of the identification algorithms makes this procedure very costly in terms of development time. In order to confront this significant cost, research into formulations of the adaptation stepsize and of the forgetting factor taking into account variations in the characteristics of the observation noise has been embarked on. The information presented in the literature regarding variable control parameters allows two types of solutions to be distinguished:

the set of adaptation stepsizes $\{\mu_t\}$ is defined in a recursive manner over time, that is to say $\mu_t$ is calculated as a function of $\mu_{t-1}, \ldots, \mu_{t-N}$ for a recursion of order N. The initialization values are in general related to the power of the observation signal, and they do not explicitly take into account the noise conditions. An example of this type is given in the article by D. T. M. Slock, "On the Convergence Behavior of the LMS and the Normalized LMS Algorithms", IEEE Trans. on Signal Processing, vol. 41, No.9, pp. 2811–2825, September 1993.

the adaptation stepsize is variable and depends in general on the short-term power of the residual error. This error introduces the concept of ambient noise insofar as it is given by the sum of the identification error proper and the observation noise. Nevertheless, this adaptation stepsize does not make it possible to distinguish between the relative significance of the observation noise and that of the identification error. An example of this type is given in the article by H. Perez Meana et al., "A Time Varying Step Size Normalized LMS Echo Canceller Algorithm", Proc. of EUSIPCO-94, pp. II-249–II-252, Edinburgh, Scotland, September 1994.

Thus, no satisfactory solution to the problem set out above has been identified within the literature.

An object of the present invention is to propose such a solution.

SUMMARY OF THE INVENTION

The invention thus proposes a process of adaptive identification for estimating the response of a system to an input signal, which comprises receiving on the one hand the input signal and on the other hand an observation signal, a component of which is said response to the input signal, determining an error signal by subtracting from the observation signal the input signal filtered by an identification filter with finite impulse response representative of the response of said system, and adapting the coefficients of the identification filter by taking into account the input signal, the error signal and an adaptation stepsize. The value of the adaptation stepsize is varied according to:

$$\mu_t = \frac{a}{c + d \cdot P2_t/P1_t} \quad (3)$$

where a, c and d denote positive constants, $P1_t$ denotes an estimate at the relevant instant of the power of the input signal and $P2_t$ denotes an estimate at the relevant instant of the power of the observation signal or of a disturbance component of said observation signal.

The expression (3) makes it possible to adjust the adaptation stepsize $\mu_t$ automatically to the noise conditions to which the system is subjected.

If the noise is assumed to be additive, the observation signal is given by the sum of the output signal from the system to be identified and the observation noise. If $P2_t$ is the power of the observation signal, the expression (3) makes it possible to obtain a value close to a/(c+dγ), where γ is an upper bound for the modulus squared of the transfer function of the system to be identified, when the power of the noise or of the disturbance is small compared with that of the input signal (and hence compared with that of the output signal), and conversely a value all the closer to 0 the more significant the noise level (the identification filter should be weakly adapted in the presence of significant noise). If $P2_t$ is the power of the disturbance component, the expression (3) provides a value of μ close to a/c when the power of the noise or of the disturbance is small compared with that of the input signal, and a value close to 0 when the noise level is significant. In practice, the constants a, c and d are chosen such that the range of variation of the adaptation stepsize corresponds to the region of stability of the algorithm used. In the case, for example, of the use of NLMS on white noise, the choice a=c makes it possible to obtain an adaptation stepsize close to 1 (optimal value for convergence in this case) when the power of the observation noise is small compared with that of the input signal of the system to be identified.

When the adaptation algorithm used takes into account a forgetting factor, it is also possible according to the invention, to vary this forgetting factor $\lambda_t$ according to:

$$\lambda_t = 1 - \frac{\mu_t}{\alpha L} \quad (4)$$

where $\lambda_t$ denotes the variable adaptation stepsize and αL denotes a positive constant.

When the adaptation algorithm does not explicitly take into account an adaptation stepsize but only a forgetting factor $\lambda_t$, the latter can have a value which is made to vary in accordance with a relation corresponding to a concatenation of formulae (3) and (4), i.e.:

$$\lambda_t = 1 - \left( \frac{a}{c + d \cdot P2_t/P1_t} \right) / \alpha L \quad (5)$$

The expression (4) or (5) also makes it possible automatically to adjust the forgetting factor $\lambda_t$ of the algorithm to the conditions of observation noise.

Thus, this forgetting factor tends to $[1-a/(c+d\lambda)\alpha L)]$ (or to $[1-a/c\alpha L]$), when the noise power is low compared with that of the input signal, and conversely to 1 as the noise level grows. This latter aspect can be explained by the lack of reliability of short-term energy estimators in the presence of significant noise and hence by the need to increase the memory of these estimators in order to exploit longer-term information.

A second aspect of the invention relates to a device for adaptive identification of a system to which an input signal is applied, comprising:

a first input receiving the input signal;

a second input receiving an observation signal, a component of which is a response of said system to the input signal;

an identification filter with finite impulse response representative of the response of said system;

a subtractor producing an error signal by subtracting from the observation signal the input signal filtered by the identification filter;

means for adapting the coefficients of the identification filter as a function of the input signal, the error signal and an adaptation stepsize and/or a forgetting factor;

first means for estimating the power of the input signal;

second means for estimating the power of the observation signal or of a disturbance component of said observation signal; and means for calculating the adaptation stepsize and/or the forgetting factor provided to the adaptation means.

If the adaptation calls upon an adaptation stepsize $\mu_t$, the latter varies according to formula (3) above. If the adaptation calls upon a forgetting factor $\lambda_t$, the latter varies according to formula (4) or (5) above.

Such a device can in particular form part of an adaptive echo canceller. An adaptive echo canceller removes, from a return signal, echo components of a forward signal. The first input of the adaptive identification device receives the forward signal as input signal, whereas the second input receives the return signal. The error signal constitutes the output signal from the echo canceller.

Moreover, the cost constraints often compel the designers of echo cancellers to concentrate their efforts on gain variation algorithms which are less complex than adaptive identification algorithms. However, up till now, no device having gain variation has made it possible automatically to adjust to the surrounding noise conditions without using mechanisms for detecting voice activity.

In a variable-gain echo canceller, a reception gain is applied to the forward signal before it is applied to the loudspeaker (input of the echo generator system), and a transmission gain is applied to the signal picked up by the microphone (output of the echo generator system) in order to form the return signal. A reception voice activity detector (RVAD) and a transmission voice activity detector (TVAD), as well as a double speech detector (DSD) provide the necessary information to the modules calculating the transmission and reception gains. Thus, when the distant speaker is talking (detection by RVAD), the transmission gain is reduced so as to attenuate the echo. Should the local speaker take his turn to speak (detection by TVAD), this constraint on the transmission gain is relaxed and the reception gain is reduced. In the event of double speech (both speakers talking simultaneously; a phenomenon detected by DSD), a comparator determines the speaker for which the level is highest and favours his direction of transmission, or else an intermediate setting of the transmission and reception gains is established.

These conventional methods are found wanting in three important situations:

for terminals with strong coupling, the required variation in gain makes the conversation almost alternate-type. This potential alternation may cause truncation of the starts and ends of words, considerably impairing the intelligibility of the conversation.

in a strongly noise-affected environment (mobile context for example), the comparator may remain frozen in one direction of transmission, thus making communication one-way. In such an environment, the distant speaker may also notice significant variations in the noise level, greatly impairing his listening comfort.

voice activity detection and double speech devices do not exhibit perfect reliability, in particular in strongly noise-affected situations. Such a lack of reliability may lead to erroneous gain calculations, reducing the quality of conversation.

Another object of the present invention is to propose an echo suppression procedure based on adaptive variation of gains, which improves the performance thereof and reduces the complexity thereof.

The invention thus proposes a process of echo cancellation for attenuating, in a return signal, echo components of a forward signal, which comprises applying a reception gain to the forward signal so as to produce an input signal sent to an echo generator system, and applying a transmission gain to an observation signal emanating from the echo generator system so as to produce said return signal. According to the invention, the reception and transmission gains are determined on the basis of an adaptation variable $\mu_t$ calculated, at an instant at which an estimate of the power of the forward signal or of the input signal is greater than a predetermined threshold, in the form:

$$\mu_t = \frac{a}{c + d \cdot P2_t/P1_t} \quad (3)$$

where a, c and d denote positive constants, and $P2_t$ denotes an estimate at the relevant instant of the power of the observation signal or of the return signal.

The adaptation variable $\mu_t$ takes account of the speech, echo and noise conditions in an appropriate manner in order to determine the values of the gains. If the power $P1_t$ is less than the threshold, there is normally no significant echo signal, it being possible for the variable $\mu_t$ to then be zero. In the situation of a simple echo, the power of the observation signal is less than M times the power of the input signal, where M is an upper bound of the modulus squared of the transfer function of the echo generator system. In this case, the variable $\mu_t$ is close to its maximum value a/(b+c.M). In the presence of echo, noise and local speech (double speech), the power $P2_t$ becomes greater than, or even much greater than, the power $P1_t$, so that $\mu_t$ tends to 0.

Taking this adaptation variable $\mu_t$ into account thus makes it possible to dispense with voice activity and double speech detectors which complicate the known echo cancellers relying on the principle of adaptive gains.

Preferably, the reception gain $Gr_t$ and transmission gain $Gt_t$ are determined recursively in the form:

$$Gt_t = \lambda \cdot Gt_{t-1} + (1-\gamma) \cdot f(\mu_t)$$

$$Gr_t = 1 - \delta Gt_t$$

where $Gt_{t-1}$ denotes the value of the transmission gain at the previous calculation instant, $f(\mu_t)$ denotes a decreasing function of the adaptation variable $\mu_t$, and $\gamma$ and $\delta$ denote positive constants less than 1.

The transmission and reception gains are thus smoothed by means of a forgetting factor $\gamma$, this making it possible to control the reactivity of the system. This also contributes to reducing the risk of truncating the starts and ends of words.

Another aspect of the present invention relates to an echo canceller for attenuating, in a return signal, echo components of a forward signal, comprising first gain application means for applying a reception gain to the forward signal and for producing an input signal sent to an echo generator system, and second gain application means for producing the said return signal by applying a transmission gain to an observation signal emanating from the echo generator system. According to the invention, this echo canceller further comprises calculation means for determining the reception and transmission gains on the basis of an adaptation variable $P1_t$ calculated, at an instant at which an estimate $P1_t$ of the power of the forward signal or of the input signal is greater than a predetermined threshold, in the form:

$$\mu_t = \frac{a}{c + d \cdot P2_t/P1_t}$$

where a, c and d denote positive constants, and $P2_t$ denotes an estimate at the relevant instant of the power of the observation signal or of the return signal.

DESCRIPTION OF PREFERRED EMBODIMENTS

Figure 1:
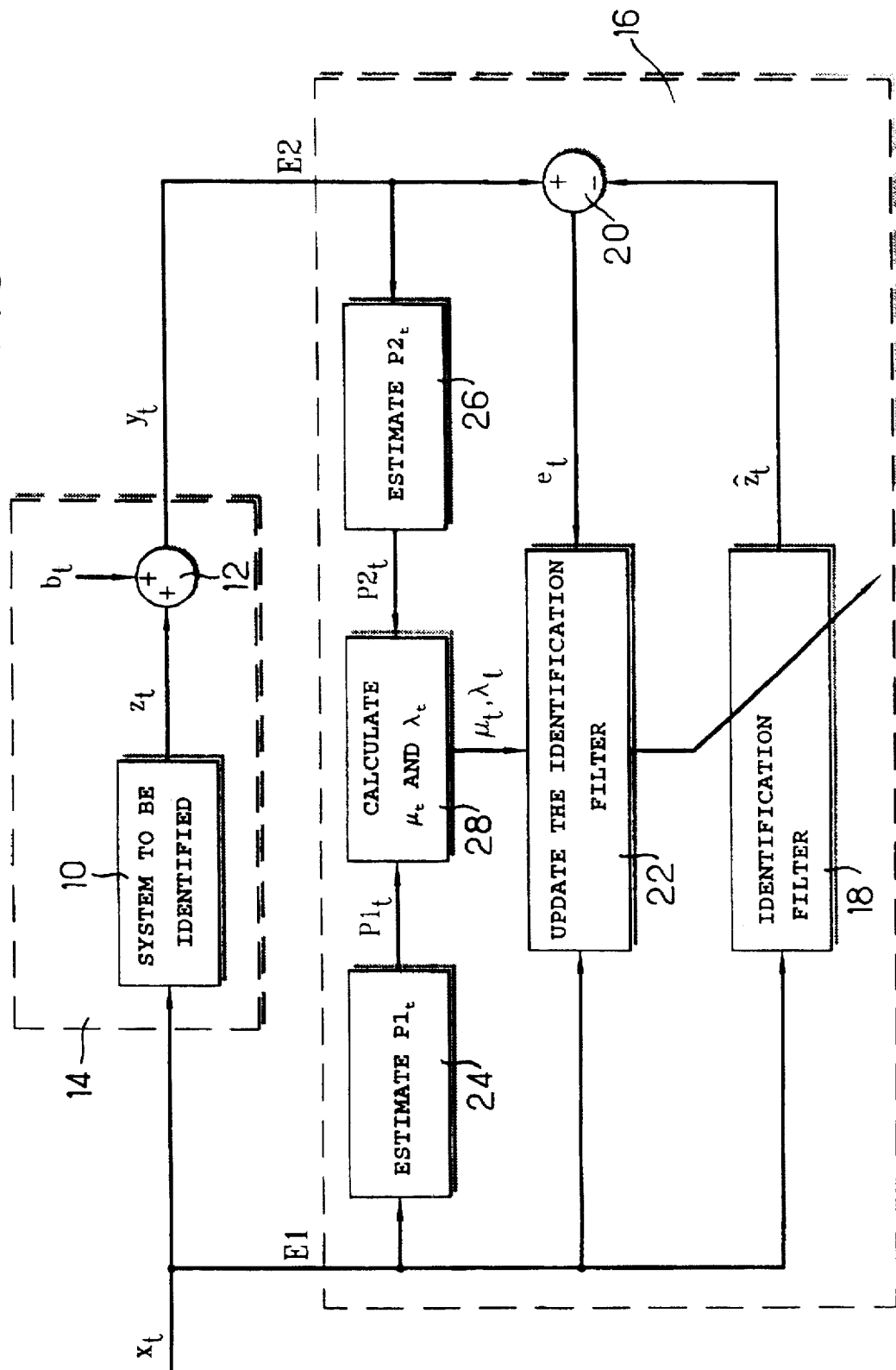
FIG. 1 is a schematic diagram of a device for adaptive identification according to the invention.

FIG. 1 shows a system to be identified 10 to which a time-varying signal $x_t$ is applied. The response of the system 10 to the input signal $x_t$ is denoted $z_t$. Measurement of the response $z_t$ is inevitably accompanied by the addition of a disturbance component $b_t$ referred to as observation noise. This observation noise $b_t$ can comprise noise properly speaking (white noise or road noise for example), but also some useful signal. The component $b_t$ is referred to as observation noise insofar as it disturbs observation of the response $z_t$. In the figure, the adder 12 symbolizes the adding of the disturbance component $b_t$, assumed to be additive, to the response $z_t$. The measured observation signal $y_t$ is thus the response of a real system 14 embracing the system to be identified 10 and the adder 12.

The adaptive identification device 16 receives the input signal $x_t$ on a first input E1, and the observation signal $y_t$ on a second input E2. The signals $x_t$ and $y_t$ are amplified, filtered and digitized at the input of the device 16 by conventional elements which are not represented.

The adaptive identification device 16 includes an identification filter 18 consisting of a programmable filter with finite impulse response. The coefficients of the identification filter 18 are adapted such that this filter is representative of the response of the system to be identified 10. The filter 18 receives the digitized input signal $x_t$ and delivers an estimate $\hat{z}_t$ of the response $z_t$ of the system 10.

A subtractor 20 deducts this estimate $\hat{z}_t$ from the digitized observation signal $y_t$ to provide an error signal $e_t$. This error signal $e_t$ can be seen as an estimate of the disturbance component $b_t$.

A unit 22 for updating the identification filter adapts the coefficients of the filter 18 on the basis of the input signal $x_t$ and of the error signal $e_t$. For the adaptation, the unit 22 takes into account an adaptation stepsize $\mu_t$ and/or a forgetting factor $\lambda_t$. In accordance with the invention, the adaptation stepsize $\mu_t$ and, as appropriate, the forgetting factor $\mu_t$, can vary as a function of the input signal and of the observation signal.

The adaptive identification device 16 includes a unit 24 which calculates an estimate P1$_t$ of the power of the input signal $x_t$, and a unit 26 which calculates an estimate P2$_t$ either of the power of the observation signal $y_t$, or of the power of the disturbance component $b_t$ of the observation system $y_t$. A unit 28 calculates the adaptation stepsize $\mu_t$ and, as appropriate, the forgetting factor $\lambda_t$ as a function of the power estimates P1$_t$ and P2$_t$, and delivers them to the identification filter updating unit 22. The adaptation stepsize $\mu_t$ is calculated according to the formula:

$$\mu_t = \frac{a}{c + d \cdot P2_t / P1_t}$$

where a, c and d denote positive constants.

If the updating algorithm implemented by the unit 22 calls upon a forgetting factor $\lambda_t$, the latter is calculated by the unit 28 according to the formula:

$$\lambda_t = 1 - \frac{\mu_t}{\alpha L}$$

where $\alpha_L$ denotes a positive constant equal to the product of a coefficient $\alpha$ and the length L, expressed in numbers of samples, of the impulse response of the identification filter 18 used.

The identification filter updating unit 22 implements, for example, the normalized least mean squares algorithm (NLMS) whose equations (1) and (2bis) were recalled in the introduction. Another example of a usable adaptation algorithm is the affine projection algorithm (APA) of order 2, whose equations are:

$$U_{L,t} = X_{L,t} - \frac{(X_{L,t}, X_{L,t-1})}{|X_{L,t-1}|^2} \tag{6}$$

$$H_{L,t} = H_{L,t-1} + \mu_t \left[ \frac{e_t}{(U_{L,t}, X_{L,t})} \right] U_{L,t} \tag{7}$$

The variable adaptation stepsize and/or the variable forgetting factor can also be used with various other adaptation algorithms which can be implemented by the unit 22.

The forgetting factor $\lambda_t$, when it is used, generally serves for the calculation of scalar products such as for example those provided for in equation (6) in the case of the APA algorithm of order 2. The scalar products are then calculated recursively over an exponential window characterized by the value of the forgetting factor:

$$\langle X_{L,t}, X_{L,t-1}\rangle = \lambda_t \langle X_{L,t-1}, X_{L,t-2}\rangle + x_t x_{t-1} \tag{8}$$

or $$\langle X_{L,t}, X_{L,t-1}\rangle = \lambda_t \langle X_{L,t-1}, X_{L,t-2}\rangle + (1-\lambda_t) x_t x_{t-1} \tag{8bis}$$

and $$\|X_{L,t-1}\|^2 = \lambda_t \|X_{L,t-2}\|^2 + x_{t-1}^2 \tag{9}$$

or $$\|X_{L,t-1}\|^2 = \lambda_t \|X_{L,t-2}\|^2 + (1-\lambda_t) x_{t-1}^2 \tag{9bis}$$

The expression (9) or (9bis) can also be used to calculate $\|X_{L,t}\|^2$ (equation (2bis)) in the case of the NLMS algorithm. The value of the coefficient $\alpha$ serving to calculate the variable forgetting factor $\lambda_t$ depends on the adaptation algorithm used. The value $\alpha=1$ is generally suitable for gradient or projection type algorithms, whereas $\alpha=3$ is suitable for FRLS type algorithms.

An example of an adapatation algorithm which implements only the variable forgetting factor $\lambda_t$ (defined by equation (5) with $\alpha=3$) is the RLS (Recursive Least Squares) algorithm with exponential forgetting given by the following equations (10) to (15):

Initialization:

$$R_{L,0}^{-1} = c \cdot I_L$$

c being a positive real and $I_L$ the identity matrix of dimensions L×L.

Acquisition of $x_t$ and $y_t$; storage of $x_t$

Calculation of the Kalman gain:
  calculation of an intermediate vector $K_{L,t}$ and intermediate scalar $k_{L,t}$:

$$K_{L,t} = R_{L,t-1}^{-1} \cdot X_{L,t} \tag{10}$$

$$k_{L,t} = \lambda_t + \langle K_{L,t}, X_{L,t}\rangle \tag{11}$$

calculation of the Kalman gain:

$$C_{L,t} = -\frac{1}{k_{L,t}} K_{L,t} \tag{12}$$

Updating of the inverse of the autocorrelation matrix:

$$R_{L,t}^{-1} = \frac{1}{\lambda_t} \left( R_{L,t-1}^{-1} - \frac{1}{k_{L,t}} |K_{L,t}|^2 \right) \tag{13}$$

Filtering:

$$e_t = y_t - \langle H_{L,t-1}, X_{L,t}\rangle \tag{14}$$

Adaptation:

$$H_{L,t} = H_{L,t-1} - e_t C_{L,t} \tag{15}$$

Although reference was made above to temporal algorithms, the invention is equally applicable with frequency domain algorithms, i.e. ones in which the signals are converted into the frequency domain (for example by Fourier transform), filtered in the frequency domain by a programmable filter and then returned to the time domain by inverse Fourier transform. In this case, the input signals $x_t$ correspond to frequency components of the original signal which are obtained by Fourier transform or sub-band filtering, and the powers P1$_t$, P2$_t$ represent the corresponding powers. It may be noted that the coefficients $\mu_t$ and/or $\lambda_t$ thus obtained are generally different as regards the various frequency components.

Figure 2:
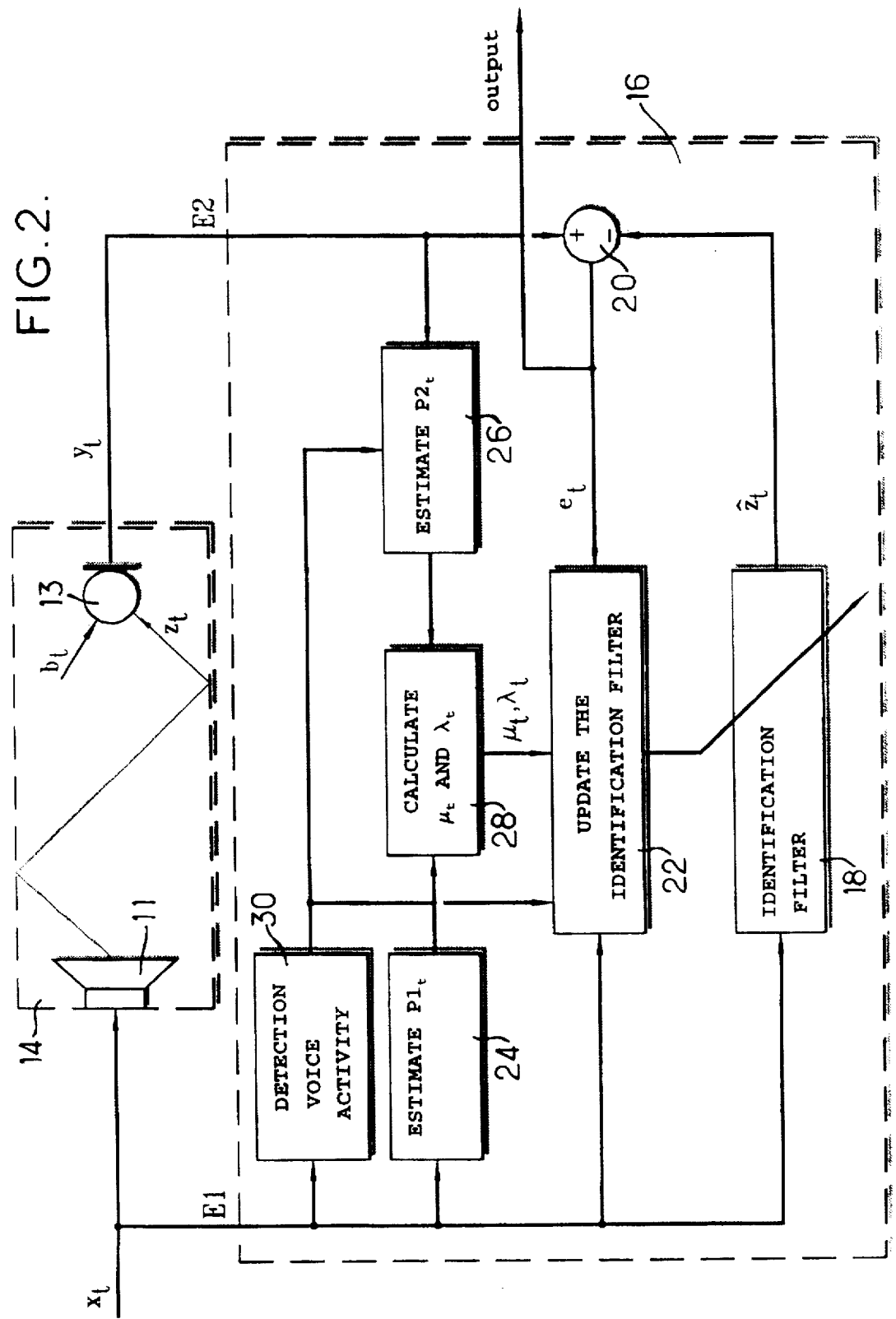
FIG. 2 is a schematic diagram of an adaptive echo canceller according to the invention.

FIG. 2 shows an adaptive echo canceller incorporating an adaptive identification device 16 of the type described with reference to FIG. 1. The echo canceller is associated with a hands-free telephone installation. The input signal $x_t$ is the forward signal directed to the loudspeaker 11 of the hands-free installation. The observation signal $y_t$ is the return signal gathered by the microphone 13 of the hands-free installation. This observation signal $y_t$ embraces components $z_t$ which are echoes of the forward signal, and disturbance components $b_t$ which may embrace noise and the speech transmitted by the speaker. The system to be identified consists of the echo path or paths between the loudspeaker 11 and the microphone 13.

In its application to an adaptive echo canceller, the adaptive identification system 16 includes a voice activity detector 30 which indicates whether the forward signal $x_t$ is vocally active or inactive. Such voice activity detectors are conventionally used in echo cancellers. The unit 22 updates the identification filter 18 only when the forward signal $x_t$ endorses voice activity.

To estimate the power $P1_t$ of the input signal $x_t$, the unit 24 uses an exponential window whose time constant is related to the magnitude $\gamma=1-1/L$:

$$P1_t=\gamma\cdot P1_{t-1}+x_t^2 \quad (16)$$

or $$P1_t=\gamma\cdot P1_{t-1}+(1-\gamma)x_t^2 \quad (16\text{bis})$$

where $x_t$ represents the sample of the input signal at the instant t.

The same exponential window can be used by the unit 26 to calculate the estimate $P2_t$. If $P2_t$ represents an estimate of the power of the observation signal, this power is given by $$P2_t=\gamma\cdot P2_{t-1}+y_t^2 \quad (17)$$

or $$P2_t=\gamma\cdot P2_{t-1}+(1-\gamma)y_t^2 \quad (17\text{bis})$$

where $y_t$ is the sample of the return signal at the instant t. If the estimate $P2_t$ represents the power of the disturbance component of the observation signal, the unit 26 implements the same formula (17) or (17bis), but only at instants at which the voice activity detector 30 indicates that the forward signal is vocally inactive.

The above echo canceller has the advantage of being relatively robust vis-à-vis the double speech phenomenon (the case in which local speech is superimposed on the echo signal). The double speech situation leads to the power estimate $P2_t$ being increased, and hence to the value of the adaptation stepsize $\mu_t$ being decreased. Automatic adjustment of the adaptation stepsize $\mu_t$ thus makes it possible to limit the significance of the adaptation in the double speech situation, without it being vital to detect these double speech situations specially. Laboratory trials have confirmed good performance of the echo canceller in the double speech situation.

In practice, this echo canceller can be produced by programming a specialized signal processor (DSP) as is usual. It may also be produced by means of an application specific integrated circuit (ASIC) dedicated to this application.

The inventors were able to verify the improvement in performance afforded by the adaptive identification process according to the invention in an echo canceller. For example, by varying the adaptation stepsize $\mu_t$ and the forgetting factor $\lambda_t$ according to relations (3) and (4), with $P2_t$ representing the power of the disturbance component of the observation signal, and with the choice of parameters a=c=20, d=L=256 for a sampling frequency of 8 kHz, it may be observed that the APA algorithm of order 2 provides a significant increase in the attenuation of the echo (ERLE: "Echo Return Loss Enhancement") as compared to the same algorithm using a fixed adaptation stepsize, particularly in the presence of strong surrounding noise. The inventors have also verified that less disturbance to the performance of the echo canceller is obtained in the double speech situation than using a fixed adaptation stepsize. This may for example be observed with the APA algorithm of order 2 by varying the adaptation stepsize $\mu_t$ and the forgetting factor $\lambda_t$ according to relations (3) and (4) with $P2_t$ representing the power of the observation signal, and with the choice of parameters a=2.5, c=10, d=80, L=256 for a sampling frequency of 8 kHz.

The process and device for adaptive identification according to the invention make it possible to improve the performance of adaptive identification systems in a noise-affected environment. The technique presented solves the problematic matter frequently posed by the choice of parameters for control of these systems in environments in which the characteristics of the noise vary over time. Among these environments frequently encountered in practice may be cited the variation in the level of noise picked up inside a vehicle when its windows are open or closed or again when passing a vehicle going in the opposite direction.

It is important to note that this choice of parameters was, up till now, made empirically in the laboratory by considering the most adverse conditions. The invention constitutes a considerable advance insofar as these same parameters are adjusted automatically and adaptively as a function of the noise conditions encountered.

This device furthermore makes it possible significantly to enhance the performance of these identification systems in the double speech situation, this considerably simplifying the control mechanisms associated with these identification systems.

Moreover, although the process and the device for adaptive identification according to the invention have been described in their application to acoustic echo cancellation in the context of radiocommunications with mobiles, they may equally be used in any adaptive identification system (equalization of propagation channels, cancellation of electrical echo for telephony, automatic process controls for production management, etc).

The plurality of fields of application of the invention described above can only enhance its major advantage, namely the very significant improvement in the performance of systems for adaptive identification obtained through an automatic and adaptive device, and this within environments whose noise characteristics vary over time.

Figure 3:
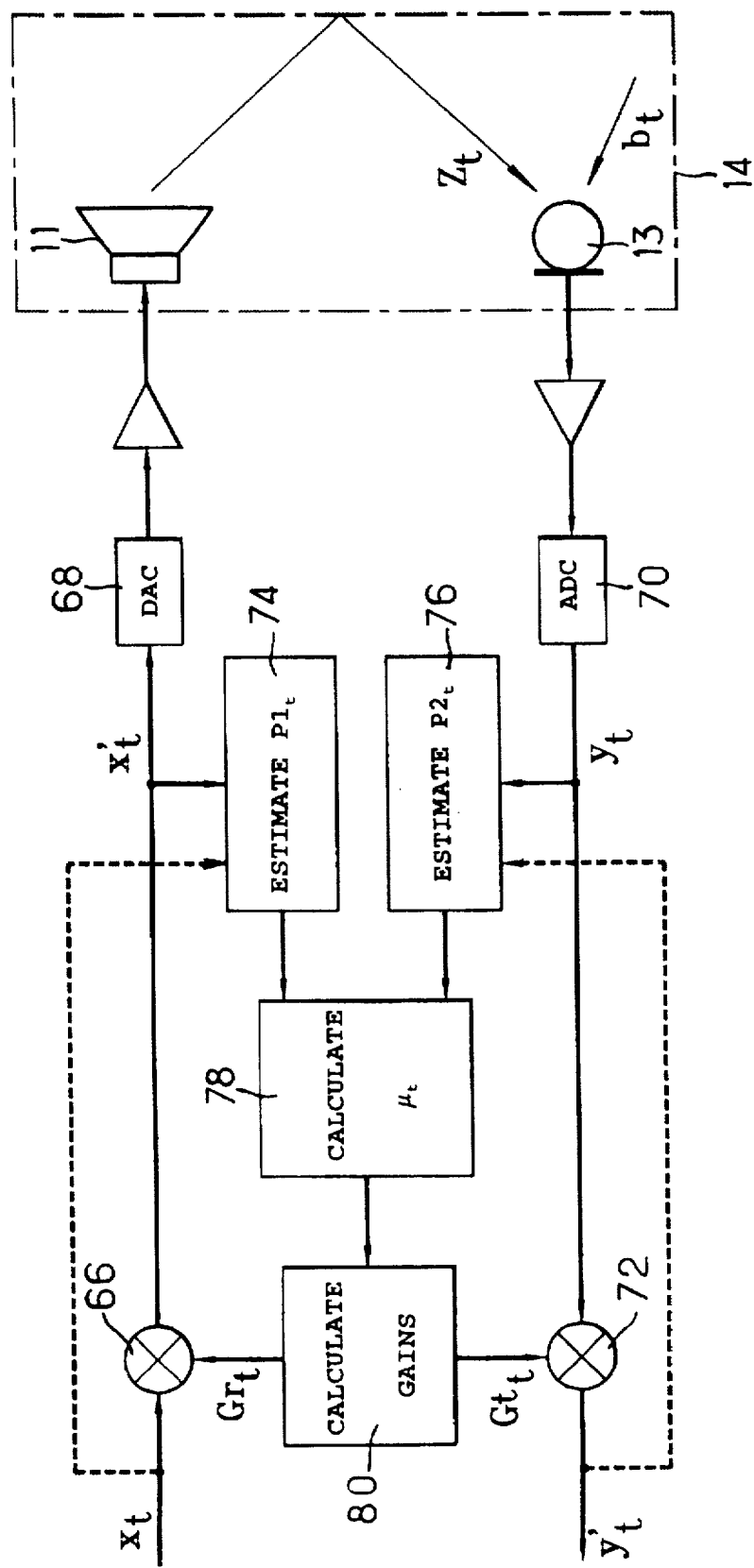
FIG. 3 is a schematic diagram of another embodiment of an echo canceller according to the invention.

FIG. 3 shows another device implementing the present invention, consisting for example of a hands-free telephone apparatus. It is assumed that this apparatus receives and transmits digital signals $x_t$, $y'_t$ respectively referred to as the forward signal and return signal, the notation employed with reference to FIGS. 1 and 2 being given below (in the case of analog communications, appropriate converters are provided so that the signals $x_t$ and $y'_t$ are available in digital form, the index t=0,1,2, . . . denoting the successive sampling instants).

In the example represented, the hands-free apparatus includes a loudspeaker 11 and a microphone 13 forming part of an echo generator system 14.

An input signal $x'_t$ is obtained by applying a reception gain Gr, to the forward signal $x_t$ by means of a multiplier 66. The input signal $x'_t$ is converted to analog by a converter 68 and amplified before being applied to the loudspeaker 11.

The signal picked up by the microphone 13 generally comprises echo components $z_t$ arising from the signal output by the loudspeaker 11, and components of local origin $b_t$ which may comprise noise and/or the useful signal (the speech of the local speaker). This signal from the microphone 13 is amplified and digitized by the converter 70 to produce a digital observation signal $y_t$.

A transmission gain Gt, is applied by means of a multiplier 72 to the observation signal $y_t$ to produce the return signal $y'_t$.

To determine the reception and transmission gains, the echo canceller comprises two units 74, 76 for estimating instantaneous powers, a unit 78 for calculating an adaptation variable $\mu_t$ and a unit 80 for calculating gains. In the case represented in FIG. 3, the estimate P1, calculated by the unit 74 is the estimate of the power of the input signal $x'_t$ and the estimate P2, calculated by the unit 76 is the estimate of the power of the observation signal $y_t$.

To estimate the power P1, of the input signal $x'_t$ at an instant t, the unit 74 uses an exponential window whose time constant is denoted $\lambda_1$ ($0 \leq \lambda_1 < 1$):

$$P1_t = \lambda_1 \cdot P1_{t-1} + x'^2_t \qquad (18)$$

or $$P1_t = \lambda_1 \cdot P1_{t-1} + (1-\lambda_1) x'^2_t \qquad (18\text{bis})$$

where $x'_t$ represents the sample of the input signal at the instant t.

The same type of exponential window can be used by the unit 76 to calculate the estimate P2$_t$. If P2$_t$ represents an estimate of the power of the observation signal $y_t$, this estimate is given by:

$$P2_t = \lambda_2 \cdot P2_{t-1} + y_t^2 \qquad (19)$$

or $$P2_t = \lambda_2 \cdot P2_{t-1} + (1-\lambda_2) y_t^2 \qquad (19\text{bis})$$

where $y_t$ is the sample of the input signal at the instant t and $0 \leq \lambda_2 < 1$ ($\lambda_2$ equal to or different from $\lambda_1$).

Figure 4:
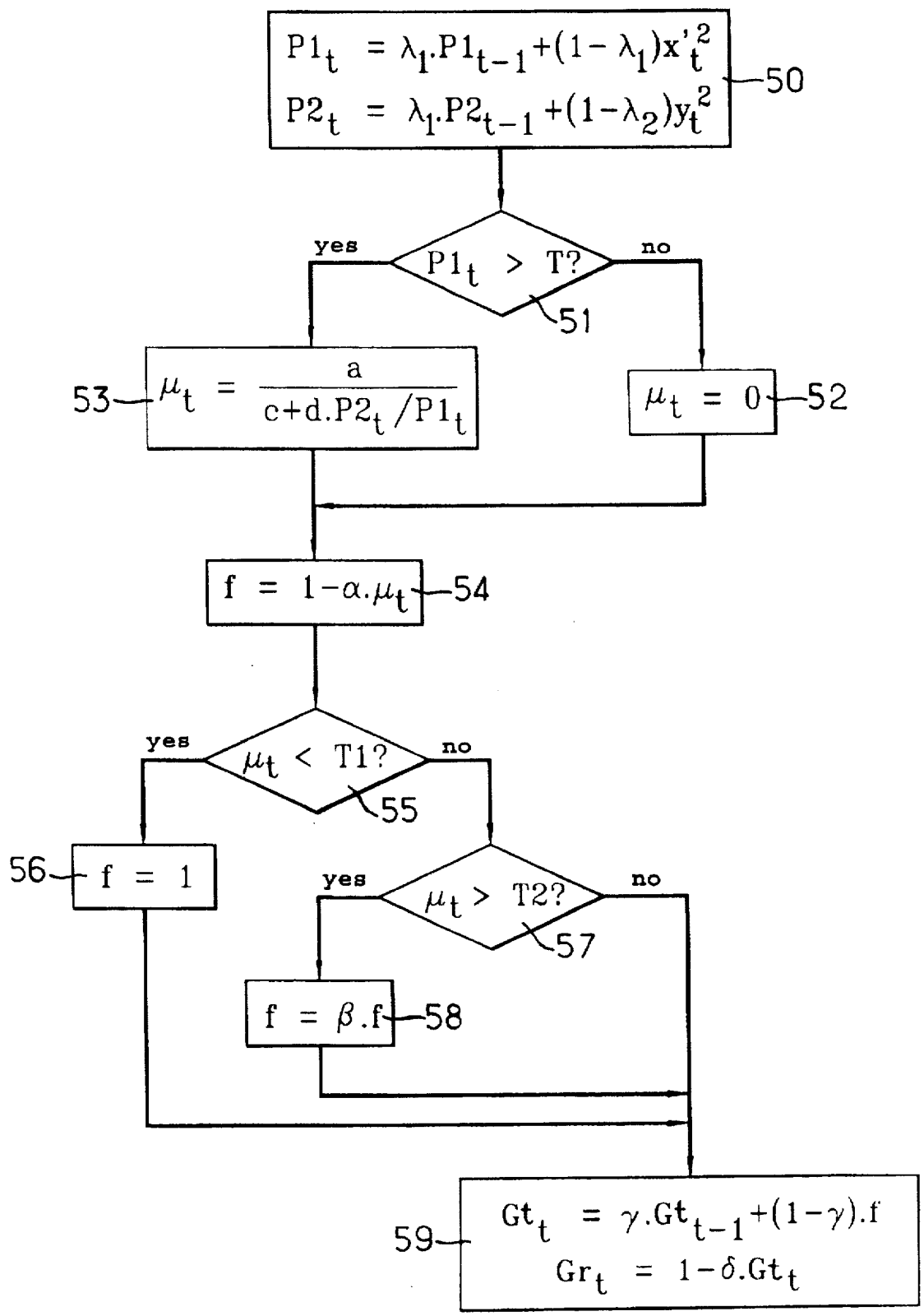
FIG. 4 is a flowchart of a procedure for adapting gains according to the invention.

Step 50 in FIG. 4 represents the operations performed by the units 74 and 76 (the case of formulae (18bis) and (19bis)).

The unit 78 calculates, on the basis of the estimates P1$_t$ and P2$_t$, an adaptation variable $\mu_t$ used to determine values of gains. The unit 78 thus executes steps 51 to 53 represented in FIG. 4. It firstly determines whether the power estimate P1$_t$ is greater than a threshold T (which may be fixed or adaptive). If P1$_t$>T, then the adaptation variable $\mu_t$ is taken equal to 0. Otherwise, it is calculated according to:

$$\mu_t = \frac{a}{c + d \cdot P2_t/P1_t}$$

where a, c and d denote positive constants.

The unit 80 then calculates, as a function of the variable $\mu_t$, the gains Gr, and Gt, delivered to the multipliers 66, 72. In a first phase, the unit 80 calculates a magnitude f in the form of a decreasing function $f(\mu_t)$ of the adaptation variable $\mu_t$. In the example illustrated in FIG. 4 (steps 54 to 58), this function $f(\mu_t)$ equals 1 if the adaptation variable $\mu_t$ is less than a first threshold T1, $\beta(1-\alpha \cdot \mu_t)$ if the adaptation variable $\mu_t$ is greater than a second threshold T2, and $1-\alpha \cdot \mu_t$ if the adaptation variable $\mu_t$ is between the thresholds T1 and T2. The parameters $\alpha$ and $\beta$ are positive constants. The thresholds T1 and T2 can be fixed or adaptive. The constant $\beta$, generally less than 1, makes it possible to emphasize the small values of the variable $\mu_t$, this allowing greater flexibility in the choice of the parameters a, c and d.

An exponential window next makes it possible to calculate the transmission gain Gt, in the form of a time-smoothed version of the previously calculated magnitude f. Thus, in step 59, the unit 80 calculates the transmission gain Gt, at the instant t in the form $$Gt_t = \gamma \cdot Gt_{t-1} + (1-\gamma) \cdot f$$

where $\gamma$ is a forgetting factor between 0 and 1. The reception gain Gr, at the instant t is also calculated according to $$Gr_t = 1 - \delta \cdot Gt_t$$

$\delta$ being a constant between 0 and 1.

With the above mode of calculation, the reception and transmission gains are related directly to the energy of the acoustic echo, this making it possible to attenuate the echo in an adaptive manner and to reduce the risk of truncating the starts and ends of words.

Furthermore, the range of variation of the transmission gain Gt, is a decreasing function of the noise level, this making it possible considerably to reduce the risks of abrupt variation in the noise level noticed by the distant speaker.

It may be noted that these advantages have been obtained without recourse to voice activity detectors or double speech detectors, these being complex and sometimes insufficiently reliable elements in the known echo cancellers.

In practice, the echo canceller with adaptive gains according to the invention can be produced by programming a specialized signal processor (DSP) as is usual. It may also be produced by means of an application specific integrated circuit (ASIC) dedicated to this application.

Of course, if sound pickup uses several microphones and/or if sound reproduction uses several loudspeakers, the "input signal" and the "observation signal" whose powers are estimated may consist of linear combinations of the signals measured by the microphones or addressed to the loudspeakers.

Moreover, by suitably adjusting the constants used, the estimate P1$_t$ calculated by the unit 74 can correspond to the power of the forward signal $x_t$ rather than that of the input signal $x'_t$, and the estimate P2$_t$ calculated by the unit 76 can correspond to the power of the return signal $y'_t$ rather than to that of the observation signal $y_t$ as shown diagrammatically by the dashed arrows in FIG. 3.

The inventors have been able to verify the good performance of the process for adapting gains according to the invention in an echo canceller. By way of illustrative example, the process has exhibited good performance in the presence of echo only in silence and in noise, and in the presence of double speech, with the following numerical values:

the various digital signals are sampled over 16 bits at 8 kHz;

$\lambda_1=0.9375$, and $\lambda_2=0.9961$ (step 50);

T=100 000 (step 51);

a=1, c=2 and d=4 (step 53);

$\alpha=2$, $\beta=0.1$, T1=0.2 and T2=0.25 (steps 54 to 58);

$\gamma=0.9375$ and $\delta=0$ (step 59).

We claim:

1. Process of adaptive identification for estimating the response of a system to an input signal, which comprises receiving on the one hand the input signal and on the other hand an observation signal, a component of which is said response to the input signal, determining an error signal by subtracting from the observation signal the input signal filtered by an identification filter with finite impulse response representative of the response of said system, and adapting the coefficients of the identification filter by taking into account the input signal, the error signal and an adaptation stepsize, wherein the value of the adaptation stepsize $\mu_t$ is varied according to:

$$\mu_t = \frac{a}{c + d \cdot P2_t/P1_t}$$

where a, c and d denote positive constants, $P1_t$ denotes an estimate at the relevant instant of the power of the input signal and $P2_t$ denotes an estimate at the relevant instant of the power of the observation signal or of a disturbance component of said observation signal.

2. Process according to claim 1, wherein the adaptation of the coefficients of the identification filter takes into account a variable forgetting factor $\lambda_t$ of the form:

$$\lambda_t = 1 - \frac{\mu_t}{\alpha L}$$

where $\mu_t$ denotes the variable adaptation stepsize and $\alpha L$ denotes a positive constant.

3. Process of adaptive identification for estimating the response of a system to an input signal, which comprises receiving on the one hand the input signal and on the other hand an observation signal, a component of which is said response to the input signal, determining an error signal by subtracting from the observation signal the input signal filtered by an identification filter with finite impulse response representative of the response of said system, and adapting the coefficients of the identification filter by taking into account the input signal, the error signal and a forgetting factor, wherein the value of the forgetting factor $\lambda_t$ is varied according to:

$$\lambda_t = 1 - \left( \frac{a}{c + d \cdot P2_t/P1_t} \right)/\alpha L$$

where a, c, d and $\alpha L$ denote positive constants, $P1_t$ denotes an estimate at the relevant instant of the power of the input signal and $P2_t$ denotes an estimate at the relevant instant of the power of the observation signal or of a disturbance component of said observation signal.

4. Device for adaptive identification of a system to which an input signal is applied, comprising:

a first input receiving the input signal;

a second input receiving an observation signal, a component of which is a response of said system to the input signal;

an identification filter with finite impulse response representative of the response of said system;

a subtractor producing an error signal by subtracting from the observation signal the input signal filtered by the identification filter;

means for adapting the coefficients of the identification filter as a function of the input signal, the error signal and an adaptation stepsize;

first means for estimating the power of the input signal;

second means for estimating the power of the observation signal or of a disturbance component of said observation signal; and means for calculating the adaptation stepsize delivered to the adaptation means, the adaptation stepsize $\mu_t$ varying according to the formula:

$$\mu_t = \frac{a}{c + d \cdot P2_t/P1_t}$$

where a, c and d denote positive constants, $P1_t$ is the power estimate provided by the first estimation means and $P2_t$ is the power estimate provided by the second estimation means.

5. Device according to claim 4, wherein the means for adapting the coefficients of the identification filter take into account a variable forgetting factor $\lambda_t$ calculated by the calculation means according to:

$$\lambda_t = 1 - \frac{\mu_t}{\alpha L}$$

where $\mu_t$ denotes the variable adaptation stepsize and $\alpha L$ denotes a positive constant.

6. Device for adaptive identification of a system to which an input signal is applied, comprising:

a first input receiving the input signal;

a second input receiving an observation signal, a component of which is a response of said system to the input signal;

an identification filter with finite impulse response representative of the response of said system;

a subtractor producing an error signal by subtracting from the observation signal the input signal filtered by the identification filter;

means for adapting the coefficients of the identification filter as a function of the input signal, the error signal and a forgetting factor;

first means for estimating the power of the input signal;

second means for estimating the power of the observation signal or of a disturbance component of said observation signal; and means for calculating the forgetting factor delivered to the adaptation means, the forgetting factor $\lambda_t$ varying according to the formula:

$$\lambda_t = 1 - \left( \frac{a}{c + d \cdot P2_t/P1_t} \right)/\alpha L$$

where a, c, d and $\alpha L$ denote positive constants, $P1_t$ is the power estimate delivered by the first estimation means and $P2_t$ is the power estimate delivered by the second estimation means.

7. Adaptive echo canceller for removing, from a return signal, echo components of a forward signal, comprising an identification device, wherein said identification device includes:

- a first input receiving the forward signal;
- a second input receiving an observation signal, a component of which is a response of an echo generating system to the forward signal;
- an identification filter with finite impulse response representative of the response of said system;
- a subtractor producing an error signal by subtracting from the observation signal the forward signal filtered by the identification filter;
- means for adapting the coefficients of the identification filter as a function of the forward signal, the error signal and an adaptation stepsize;
- first means for estimating the power of the forward signal;
- second means for estimating the power of the observation signal or of a disturbance component of said observation signal; and
- means for calculating the adaptation stepsize delivered to the adaptation means, the adaptation stepsize $\mu_t$ varying according to the formula:

$$\mu_t = \frac{a}{c + d \cdot P2_t/P1_t}$$

where a, c and d denote positive constants, $P1_t$ is the power estimate provided by the first estimation means and $P2_t$ is the power estimate provided by the second estimation means, wherein said second input receives the return signal as said observation signal, and wherein the error signal constitutes an output signal from the echo canceller.

8. Adaptive echo canceller according to claim 7, wherein the means for adapting the coefficients of the identification filter take into account a variable forgetting factor $\lambda_t$ calculated by the calculation means according to:

$$\lambda_t = 1 - \frac{\mu_t}{\alpha L}$$

where $\mu_t$ denotes the variable adaptation stepsize and $\alpha L$ denotes a positive constant.

9. Adaptive echo canceller for removing, from a return signal, echo components of a forward signal, comprising an identification device, wherein said identification device includes:

- a first input receiving the forward signal;
- a second input receiving an observation signal, a component of which is a response of an echo generating system to the forward signal;
- an identification filter with finite impulse response representative of the response of said system;
- a subtractor producing an error signal by subtracting from the observation signal the forward signal filtered by the identification filter;
- means for adapting the coefficients of the identification filter as a function of the forward signal, the error signal and a forgetting factor;
- first means for estimating the power of the input signal;
- second means for estimating the power of the observation signal or of a disturbance component of said observation signal; and
- means for calculating the forgetting factor delivered to the adaptation means, the forgetting factor $\lambda_t$ varying according to the formula:

$$\lambda_t = 1 - \left( \frac{a}{c + d \cdot P2_t/P1_t} \right) / \alpha L$$

where a, c, d and $\alpha L$ denote positive constants, $P1_t$ is the power estimate delivered by the first estimation means and $P2_t$ is the power estimate delivered by the second estimation means, wherein said second input receives the return signal as said observation signal, and wherein the error signal constitutes an output signal from the echo canceller.

10. Process of echo cancellation for attenuating, in a return signal, echo components of a forward signal, which comprises applying a reception gain to the forward signal so as to produce an input signal sent to an echo generating system, and applying a transmission gain to an observation signal emanating from the echo generating system so as to produce said return signal, wherein the reception and transmission gains are determined on the basis of an adaptation variable $\mu_t$ calculated, at an instant at which an estimate $P1_t$ of the power of the forward signal or of the input signal is greater than a predetermined threshold, in the form:

$$\mu_t = \frac{a}{c + d \cdot P2_t/P1_t}$$

where a, c and d denote positive constants, and $P2_t$ denotes an estimate at the relevant instant of the power of the observation signal or of the return signal.

11. Process according to claim 10, wherein the reception gain and transmission gain are determined recursively in the form:

$$Gt_t = \gamma \cdot Gt_{t-1} + (1-\gamma) \cdot f(\mu_t)$$

$$Gr_t = 1 - \delta Gt_t$$

where $Gt_{t-1}$ denotes the value of the transmission gain at the previous calculation instant, $f(\mu_t)$ denotes a decreasing function of the adaptation variable $\mu_t$, and $\gamma$ and $\delta$ denote positive constants less than 1.

12. Process according to claim 11, wherein the function $f(\mu_t)$ equals 1 if the adaptation variable $\mu_t$ is less than a first threshold, $\beta(1-\alpha \cdot \mu_t)$ if the adaptation variable $\mu_t$ is greater than a second threshold, $\alpha$ and $\beta$ denoting positive constants, and $1-\alpha \cdot \mu_t$ if the adaptation variable $\mu_t$ is between the first and second thresholds.

13. Echo canceller for attenuating, in a return signal, echo components of a forward signal, comprising: first gain application means for applying a reception gain to the forward signal and for producing an input signal sent to an echo generating system; second gain application means for producing said return signal by applying a transmission gain to an observation signal emanating from the echo generating system; and calculation means for determining the reception and transmission gains on the basis of an adaptation variable $\mu_t$ calculated, at an instant at which an estimate $P1_t$ of the power of the forward signal or of the input signal is greater than a predetermined threshold, in the form:

$$\mu_t = \frac{a}{c + d \cdot P2_t/P1_t}$$

where a, c and d denote positive constants, and $P2_t$ denotes an estimate at the relevant instant of the power of the observation signal or of the return signal.

14. Echo canceller according to claim 13, wherein the calculation means recursively determine the reception gain $Gr_t$ and transmission gain $Gt_t$ in the form:

$$Gt_t = \gamma \cdot Gt_{t-1} + (1-\gamma) \cdot f(\mu_t)$$

$$Gr_t = 1 - \delta Gt_t$$

where $Gt_{t-1}$ denotes the value of the transmission gain at the previous calculation instant, $f(\mu_t)$ denotes a decreasing function of the adaptation variable $\mu_t$, and $\gamma$ and $\delta$ denote positive constants less than 1.

15. Echo canceller according to claim 14, wherein the function $f(\mu_t)$ equals 1 if the adaptation variable $\mu_t$ is less than a first threshold, $\beta(1-\alpha \cdot \mu_t)$ if the adaptation variable $\mu_t$ is greater than a second threshold, $\alpha$ and $\beta$ denoting positive constants, and $1-\alpha \cdot \mu_t$ if the adaptation variable $\mu_t$ is between the first and second thresholds.

* * * * *